United States Patent [19]

Geisel

[11] 4,379,992

[45] Apr. 12, 1983

[54] PRINTED CIRCUIT BOARD ELECTRONIC TESTER

[75] Inventor: Donald J. Geisel, Madison, N.Y.

[73] Assignee: General Electric Company, Utica, N.Y.

[21] Appl. No.: 280,671

[22] Filed: Jul. 6, 1981

Related U.S. Application Data

[63] Continuation of Ser. No. 103,972, Dec. 17, 1979, abandoned.

[51] Int. Cl.³ .............................................. G01R 31/02
[52] U.S. Cl. .................................. 324/158 F; 324/51; 324/73 PC; 324/158 P
[58] Field of Search ............ 324/158 F, 158 P, 158 R, 324/73 R, 73 PC, 51; 128/741; 433/32, 215

[56] References Cited

U.S. PATENT DOCUMENTS 3,755,900  9/1973  Friedman .............................. 433/32

*Primary Examiner*—Ernest F. Karlsen
*Attorney, Agent, or Firm*—Stephen A. Young

[57] ABSTRACT

An automated testing apparatus which performs shorts and continuity testing on a printed circuit board or ceramic substrate submerged in an ionic conducting solution is disclosed comprising a central controlling device which interfaces with an electrical measuring instrument, a numerical control table to position a moveable probe over the unit under test so as to measure its electrical characteristics, and a strip printer to display results.

6 Claims, 2 Drawing Figures

PRINTED CIRCUIT BOARD ELECTRONIC TESTER

This is a continuation of application Ser. No. 103,972, filed Dec. 17, 1979, now abandoned.

BACKGROUND OF THE INVENTION

1. Field of the Invention

The present invention relates to a shorts and continuity tester, and more specifically to one which utilizes an ionic solution to measure the electrical characteristics of various portions of a multilayered printed circuit board or ceramic substrate.

2. Description of the Prior Art

A multipoint "bed of nails" type fixture has been one way in which shorts and continuity checking has been performed on multilayered printed circuit boards and ceramic substrates. With such a structure each "nail" is connected to at least one other "nail" by way of an electrical measuring instrument such as an ohmmeter. As the "bed of nails" fixture is positioned over the circuit board to be checked, the resistance value is measured between the two "nails" which come into contact with two points on the circuit board. The measured resistance value is then compared to the resistance value expected between those two points in the circuit. A difference between the two values is an indication of a malfunction which necessitates further investigation.

One disadvantage of this type of fixture is that it requires contact with all points on the circuit board under test. Furthermore, as the state of the art advances in the miniaturization of printed circuit boards, their conductor paths can be printed closer and closer together. As the conductor paths are fabricated closer together, it is physically more difficult to configure a "bed of nail" type testing fixture that will operate reliably due to the close proximity required for adjacent "nail" probes.

Accordingly, it is an object of the present invention to provide a relatively simple, lower cost and more reliable means in which to accomplish electrical measurements on printed circuit boards.

It is a further object of the invention to eliminate the long turn around time required to design and construct prior art test fixtures.

BRIEF DESCRIPTION OF THE DRAWINGS

Various other objects, features and attendant advantages of the present invention will be more fully appreciated from the following detailed description when considered in connection with the accompanying drawings.

DESCRIPTION OF THE PREFERRED EMBODIMENT

To provide an insight to the basic principle of the testing technique a brief explanation of ionic conduction is in order. When two electrodes are placed in an ionic (conduction solution), an AC measurement device will display impedance (resistance and/or capacitative reactance) values. These values are related to the conductivity of the solution, the surface area and shape of the electrodes and the distance between the electrodes. If one electrode is mechanically fixed and the solution conductivity held constant, while the other electrode moves then the measured impedance will increase as the distance between the electrodes increases.

Figure 1:
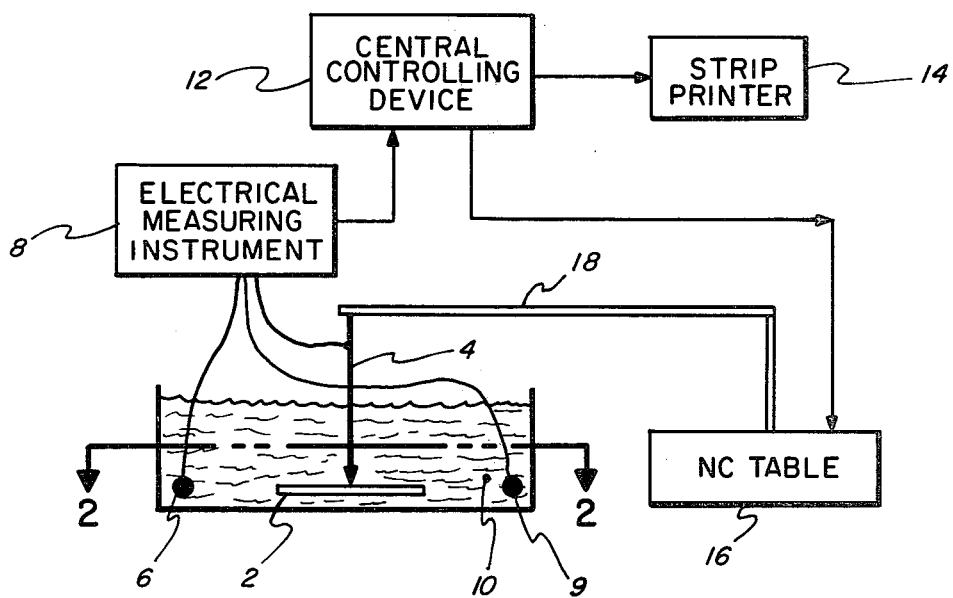
FIG. 1 represents a block diagram of the present invention.

Referring now to the drawings, and more specifically to FIG. 1, thereof, the instant invention utilizes the conduction properties of an ionic solution to perform shorts and continuity testing. The unit under test, element 2, is placed in the solution where it is examined by a single point probe 4. This probe in conjunction with reference electrode 6 and electrical measuring instrument 8 cooperate to measure the electrical properties of unit 2.

Figure 2:
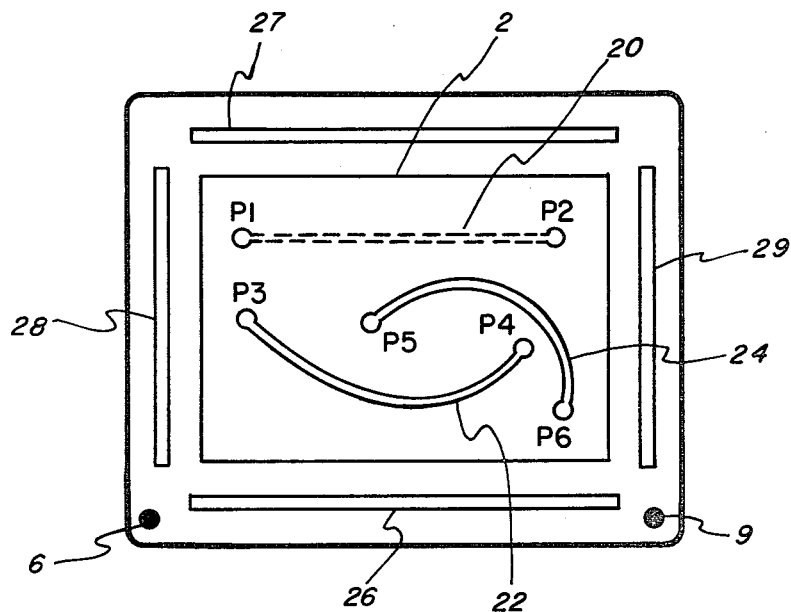
FIG. 2 is a top view of the ionic solution bath shown in FIG. 1.

When a ceramic substrate or multi-layered printed circuit board is the unit under test and is placed in an ionic solution, each connection point on the unit can be considered as a different electrode. FIG. 2 illustrates a typical printed circuit board having conductor paths 20, 22 and 24. When movable probe 4 contacts points P1 or P2, P3 or P4, and P5 or P6, respectively, the points and/or conductors 20, 22 or 24 act as one of three different electrodes in conjunction with the reference electrode 6 to form a unique conductivity cell. Movable probe 4 is insulated from the ionic solution except for a minute point at its tip which makes electrical contact with each respective electrode on the unit under test.

If probe 4 were in contact with P1 or P2 when electrical measuring instrument 8 is an AC ohmmeter, the impedance measured by instrument 8 would be unique to P1, P2 and conductor 20. In an analogous manner, conductors 22, P3, P4 and 24, P5, P6 would each have a unique or a characteristic impedance between each respective element through conducting solution 10 to reference electrode 6.

To simply state the basic testing principle, those points on a unit under test which are electrically connected will have the same characteristic resistance and capacitative reactance value.

The instant invention as configured in FIG. 1 is a fully automated testing apparatus. Computer 12 is the central controlling device which is interfaced with electrical measuring instrument 8, numerical control table 16, and strip printer 14. The basic approach is for numerical control table 16 to move probe 4 by way of support means 18 over the unit under test and make impedance measurements utilizing an AC ohmmeter as electrical measuring instrument 8. These measurements are then sent to computer 12 over a hardware interface where they are processed. The objective is to make measurements on the unit under test 2, in order to determine which paths are connected, open or shorted, thus performing a shorts and continuity test.

In some situations, two totally different (not electrically connected) points on a unit under test will have characteristic impedance readings that are close in value. One way in which to eliminate any ambiguity is to use more than one reference electrode 6 so that more than one characteristic reading can be taken for each point on a unit under test. By having reference electrode 9 positioned adjacent to reference electrode 6, the distances between either electrode and any conductor pattern on a printed circuit board would be unequal, thereby yielding two different characteristic impedance readings.

There are two operational approaches to testing a product. In most cases, a product design and knowledge of expected continuities would allow a computer programmer to direct the automatic tester to first record all characteristic impedances of a unit under test and then have computer 12 automatically compare all characteristic impedance values to check for undesired matches. Such matches would be shorts. In this mode, strip printer 14 would print either a PASS or a FAIL plus failure data.

The second approach is to direct the computer to make characteristic impedance measurements and process the data to determine what points are electrically connected. In this mode, strip printer 14 lists all continuities on a unit under test. It should be noted that whatever mode of testing is used, the programmer must input in advance to the computer the x and y co-ordinates for each move of probe 4.

When electrical measuring instrument 8 is configured as an AC ohmmeter, it consists of an AC signal source. The signal source could be a function generator which is stable in amplitude and frequency to four significant figures. It is used as a stimulus for the "characteristic impedance" measurements in the conducting solution.

All testing is done in thermally insulated and temperature stable bath 10. The temperature stability is necessary because the solution conductivity changes approximately 2 percent per degree centigrade. One type of conducting solution is potassium phosphate monobasic sodium hydroxide, a buffer reagent with a pH of 7.

Submerged in the solution is a non-metallic adjustable holder to accomodate a wide range of units under test. It can also be moved in the horizontal plane for alignment with movable probe 4.

Strip printer 14 is a high speed small printer used to display testing results. Recorded data strips can be torn off and attached to the unit under test as it travels down a production line.

The numerically controlled table 16 is a high speed (10"/sec.) xy table used to move an electrically insulated probe 4 over the unit under test. The table having a travel of 10" by 10" is controlled by local electronics which interface to controlling computer 12. There are also local manual controls which allow an operator to manually move insulated probe 4 in order to make simple measurements, program position coordinates, or to reference the XY table to the product.

Insulated probe 4 is attached to numerical control table 16 by way of a light weight probe arm 18 which extends over the testing bath. Arm 18 allows for the positioning of insulated probe 4 by the computer controlled numerical control table 16. Probe 4 is a small tungsten needle of a diameter that tapers from 0.020" to 0.005" at the tip. The probe is completely insulated using a polymer such as polyamideimide, with the exception of a very minute area at the end of a 45° tip. The vertical motion of probe 4 is controlled by a small solenoid which is controlled by the computer.

A modification of the basic approach described above can be made to perform shorts and continuity testing by means of voltage rather than impedance measurements. In this mode electrical measuring instrument 8 would operate as a voltmeter and signal source so that characteristic voltage measurements can be taken by probe 4 with respect to a reference potential. For most applications the reference will be ground, but it could be any desired value.

An electric field is required to be imposed across the unit under test submerged in the ionic solution by means of either horizontal electrodes 28 and 29 or vertical electrodes 26 and 27. The utilization of horizontal and vertical electrodes is necessary to avoid the possibility of any two unconnected points on the unit under test having the same characteristic voltage. In this way, an independent voltage reading could be taken by movable probe 4 corresponding to each of the two electric fields established by electrodes 26, 27 or 28 and 29. One of electrodes 26 or 27 would act as a source electrode while the other would act as a sink electrode so as to impress an electric field between them. In an analogous manner one of electrodes 28 or 29 would act as a source electrode, while the other would act as a sink electrode.

When using this approach those points on a unit under test which are electrically connected will have the same characteristic voltage value.

The computer and strip printer can be programmed in a manner analogous to that when characteristic impedance measurements are taken so that the approach can be as automatic as possible.

While a preferred embodiment of the invention has been shown and described, various other embodiments and modifications thereof will become apparent to persons skilled in the art, and will fall within the scope of invention as defined in the following claims.

Having thus described the invention, what is claimed as new and desired to be secured by Letters Patent of the United States is:

1. An automated testing apparatus for performing shorts and continuity tests on a printed circuit board or ceramic substrate submerged in an ionic conducting solution comprising:
   (a) a bath composed of an ionic conducting solution;
   (b) an electrically insulated movable probe positioned within said bath and having its tip in electrical contact with one point on said printed circuit board;
   (c) at least one reference electrode positioned within said bath;
   (d) an electrical measuring instrument capable of measuring electrical characteristics, said instrument having a first lead connected to said movable probe and a second lead connected to one of said reference electrodes;
   (e) a controlled table;
   (f) a support means connected between said controlled table and said movable probe;
   (g) a central controlling device receiving values of electrical characteristics measured by said electrical measuring instrument and outputting control information to said controlled table; and
   (h) means responsive to record data generated by said central controlling device.

2. An automated testing apparatus for performing shorts and continuity tests on a printed circuit board (or ceramic substrate) submerged in an ionic conducting solution comprising;
   (a) a bath composed of an ionic conducting solution;
   (b) an insulated movable probe positioned within said bath and having its tip in electrical contact with one point on said printed circuit board or ceramic substrate;
   (c) at least one reference electrode positioned within said bath;
   (d) an A.C. meter capable of measuring the impedance between said movable probe and at least one reference electrode;
   (e) a numerical control table;
   (f) a support means controlled by said numerical control table so as to position said movable probe over a desired point on said printed circuit board (or ceramic substrate);

(g) a central controlling device receiving impedance values from said ohmmeter and outputting control information to said numerical control table; and (h) a strip printer to record data generated by said central controlling device.

3. An automated testing apparatus for performing shorts and continuity tests on a printed circuit board (or ceramic substrate) submerged in an ionic conducting solution comprising;

(a) a bath composed of an ionic conducting solution;

(b) an insulated movable probe positioned within said bath and having its tip in electrical contact with one point on said printed circuit board;

(c) a source electrode positioned on one side of said printed circuit board, and a sink electrode positioned on a second side of said printed circuit board, said source and sink electrodes each having a different voltage so as to impose an electric field between them;

(d) a voltmeter capable of measuring the voltage between said movable probe and a reference potential;

(e) a numerical control table;

(f) a support means controlled by said numerical control table so as to position said movable probe over a desired point on said printed circuit board;

(g) a central controlling device receiving characteristic voltage values from said voltmeter and outputting control information to said numerical control table; and (h) a strip printer to record data generated by said controlling device.

4. The invention of claim 3 further comprising a second source electrode positioned on one side of said printed circuit board, and a second sink electrode positioned on another side of said printed circuit board, said second source and sink electrodes each having a different voltage so as to impose an electric field between them.

5. The invention of claims 1, 2 or 3 wherein said bath is composed of a buffer reagent with a pH of 7.

6. The invention of claim 5 wherein said bath is further composed of potassium phosphate monobasic sodium hydroxide.

* * * * *